United States Patent [19]
Iwase

[11] Patent Number: 5,715,267
[45] Date of Patent: Feb. 3, 1998

[54] SEMICONDUCTOR LASER DEVICE AND METHOD OF MANUFACTURING THE SAME AS WELL AS METHOD OF COUPLING SEMICONDUCTOR LASER DEVICE AND OPTICAL WAVEGUIDE

[75] Inventor: Masayuki Iwase, Tokyo, Japan

[73] Assignee: The Furukawa Electric Co., Ltd., Tokyo, Japan

[21] Appl. No.: 411,678

[22] PCT Filed: Aug. 3, 1994

[86] PCT No.: PCT/JP94/01277

§ 371 Date: Aug. 22, 1996

§ 102(e) Date: Aug. 22, 1996

[30] Foreign Application Priority Data

Aug. 4, 1993 [JP] Japan .................. 5-212337

[51] Int. Cl.$^6$ .................. H01S 3/19; G02B 6/36; H01L 21/20
[52] U.S. Cl. .................. 372/46; 372/50; 385/90; 437/129
[58] Field of Search .................. 372/50, 46; 385/90; 437/129

[56] References Cited

U.S. PATENT DOCUMENTS

| | | | |
|---|---|---|---|
| 4,186,994 | 2/1980 | Denkin et al. | 385/90 |
| 4,787,696 | 11/1988 | Norris et al. | 385/90 |
| 4,891,816 | 1/1990 | Yoshida et al. | 372/50 |
| 4,975,923 | 12/1990 | Buus et al. | 372/50 |

FOREIGN PATENT DOCUMENTS

| | | |
|---|---|---|
| 51-108573 | 2/1975 | Japan . |
| 59-107590 | 6/1984 | Japan . |
| 02-171709 | 7/1990 | Japan . |

*Primary Examiner*—Rodney C. Bovernick
*Assistant Examiner*—Luong-Quyen T. Phan
*Attorney, Agent, or Firm*—Jacobson, Price, Holman & Stern, PLLC

[57] ABSTRACT

This invention provides a semiconductor laser device that can be accurately and easily coupled with a optical waveguide device, a method of manufacturing such a semiconductor laser device and a method of coupling such a semiconductor laser device and a optical waveguide device. A semiconductor laser device according to the invention is provided with a stripe-shaped groove that is referred to for accurately locating its light-emitting section. A method of manufacturing a semiconductor laser device according to the invention comprises steps of forming a stripe-shaped light-emitting section, a stripe-shaped nonlight-emitting section and a stripe-shaped reference groove on a semiconductor substrate. With a method of coupling a semiconductor laser device and an optical waveguide device according to the invention, the light-emitting section of the semiconductor laser device is aligned with the optical waveguide device by referring to the stripe-shaped reference groove.

19 Claims, 3 Drawing Sheets

SEMICONDUCTOR LASER DEVICE AND METHOD OF MANUFACTURING THE SAME AS WELL AS METHOD OF COUPLING SEMICONDUCTOR LASER DEVICE AND OPTICAL WAVEGUIDE

BACKGROUND OF THE INVENTION

1. Field of the Invention

This invention relates to a semiconductor laser device to be suitably used for optical telecommunications and a method of manufacturing the same. It also relates to a method of coupling a semiconductor laser device and at least one optical waveguide device.

2. Prior Art

As known well, the semiconductor laser device is a device that finds a principal application in a light source for optical telecommunications and is, in use, optically coupled with at least one optical fiber, optical waveguides or some other devices for providing at least one optical path.

For coupling a semiconductor laser device and at least one optical waveguide devices, the light-emitting sections of the semi-conductor laser device and the optical waveguide devices have to be aligned accurately to maximize the efficiency with which they operate. In other words, at least one light-emitting section of the semiconductor laser device have to be precisely located and the devices have to be aligned accurately so that the optical axes of the devices completely agree with each other.

At least one light-emitting section of the semiconductor laser device are found within the region of an active layer and an end surface of the light-emitting sections is exposed from an cleavage plane of semiconductor crystal of the device. However, since at least one light-emitting section of the semiconductor laser device is extremely small and the boundaries separating them from the surrounding members are not particularly distinct, they cannot be spotted through a microscope, if a cleavage plane of semiconductor crystal is microscopically observable.

Thus, in a situation where a semiconductor laser device and at least one optical waveguide devices are to be coupled with each other, it is not possible to locate at least one light-emitting section of the laser device without particular means specifically designed for it.

A known method of coupling a semiconductor laser device and at least one optical waveguide devices comprises the following steps.

Firstly, in step 1, an area of the semiconductor laser device containing the light-emitting section or one of the light-emitting sections, whichever appropriate, is placed vis-a-vis the incident light receiving end of a corresponding optical waveguide device.

Then, in step 2, the semiconductor laser device is caused to emit a laser beam that goes into the optical waveguide device through the entrance of light of the device, while monitoring the intensity of the beam at the exit of light and three-dimensionally adjusting the relative positions of the semiconductor laser device and the optical waveguide device until a peak intensity is obtained.

In step 3, the semiconductor laser device and the optical waveguide device are rigidly secured to each other.

If a plurality of optical waveguide devices are to be coupled to discrete single semiconductor laser devices, the above process is repeated for each coupling operation.

Although it may seem that the semiconductor laser device and the optical waveguide device are highly precisely coupled with each other by using the above coupling method because the intensity of the laser beam passing therethrough is monitored until it is maximized, this method is actually accompanied by certain drawbacks, which will be described below.

One of the problems is that the optical axis of the semiconductor laser device and that of the optical waveguide device can be separated from each other to a great extent particularly at the corresponding light-emitting section of the former and the entrance of light of the latter in step 1 because the light-emitting section of the semiconductor laser device and the core diameter of the optical waveguide device are very small and the light-emitting section of the semiconductor laser device is not distinctly observable. This problem is particular serious when the optical waveguide device comprises an single mode optical fiber having a core diameter of several microns.

Another problem is that, when the optical axis of the light-emitting section of the semiconductor laser device and that of the entrance of the optical waveguide device are moved away from each other to a large extent, it takes a long time to find a peak in the intensity of the light exiting the waveguide device.

Still another problem is that, once the semiconductor laser device is secured to the optical waveguide device in step 3, it is very time-consuming to positionally regulate them, if it is found in some later stages that the optical axis of the semiconductor laser device and that of the optical waveguide device are displaced from each other because there is no simple way to know in which direction and to which extent they are displaced.

These and other problems can take place not only when a single semiconductor laser device is coupled with a single optical waveguide device but also when an array of semiconductor laser devices and that of optical waveguide devices are mortally coupled.

SUMMARY OF THE INVENTION

In view of these technological problems, it is therefore the object of the present invention to provide an improved semiconductor laser device that can be coupled with at least one optical waveguide device without difficulty and a method of manufacturing such a device as well as a method of accurately and easily coupling a semiconductor laser device and at least one optical waveguide device.

According to an aspect of the present invention, the above object is achieved by providing a semiconductor laser device characterized in that it comprises at least one stripe-shaped light-emitting section consisting of an active layer and at least one stripe-shaped nonlight-emitting section also consisting of the active layer, said light-emitting section and said nonlight-emitting section being arranged in parallel with each other on a semiconductor substrate, and the light-emitting sections are covered by a semiconductor layer having a refractive index lower than that of the active layer, a stripe-shaped groove being arranged on and along each of the nonlight-emitting sections.

A semiconductor laser device according to the invention may be realized in various different modes of realization including those listed below.

(a) A single light-emitting section and a single nonlight-emitting section are arranged in parallel with each other on a semiconductor substrate.

(b) A single light-emitting section and a plurality of nonlight-emitting sections are arranged in parallel with each other on a semiconductor substrate.

(c) A plurality of light-emitting sections and a single nonlight-emitting section are arranged in parallel with each other on a semiconductor substrate.

(d) A plurality of light-emitting sections and a plurality of nonlight-emitting sections are arrange in parallel with each other on a semiconductor substrate.

(e) A plurality of light-emitting sections and a plurality of nonlight-emitting sections are arranged in parallel with each other on a semiconductor substrate and at least a light-emitting section is located between a pair of nonlight-emitting sections.

In the case of (e) mentioned above, all the light-emitting sections may be located between a pair of nonlight-emitting sections, or the light-emitting sections and the nonlight-emitting sections may be otherwise alternately arranged.

According to another aspect of the invention, there is provided a method of manufacturing a semiconductor laser device characterized in that it comprises steps of sequentially depositing an active layer and a cladding layer on a semiconductor substrate, processing the active layer and the cladding layer into at least one stripe-shaped light-emitting section and at least one stripe-shaped nonlight-emitting section arranged in parallel with each other, forming a stripe-shaped groove on each of the light-emitting sections and the nonlight-emitting sections by covering the upper surface of the device in areas other than those of the light-emitting sections and the nonlight-emitting sections with a semiconductor layer having a refractive index lower than that of the active layer and burying the stripe-shaped grooves only on the light-emitting sections with a semiconductor layer.

A method of manufacturing a semiconductor laser device according to the invention may be carried out in different modes in order to manufacture a semiconductor laser device according to any of (a) through (e) mentioned above.

According to still another aspect of the invention, there is provided a method of coupling a semiconductor laser device having a stripe-shaped light-emitting section and a stripe-shaped nonlight-emitting section arranged in parallel with each other and an optical waveguide device, a stripe-shaped groove being arranged on and alone said nonlight-emitting section, characterized in that it comprises steps of determining the relative positions of the light-emitting section and the optical waveguide device by referring to the nonlight-emitting section, aligning the light-emitting section of the semiconductor laser device and the optical waveguide device and coupling the semiconductor laser device and the optical waveguide device.

According to still another aspect of the invention, there is provided a method of coupling a semiconductor laser device having a plurality of stripe-shaped light-emitting sections and a stripe-shaped nonlight-emitting section arranged in parallel with each other and a plurality of optical waveguide devices, said optical waveguide devices corresponding to said light-emitting sections in number, a stripe-shaped groove being arranged on and along said nonlight-emitting section, characterized in that it comprises steps of determining the respective relative positions of the light-emitting sections and the corresponding optical waveguide devices by referring to the nonlight-emitting section, aligning respectively the light-emitting sections of the semiconductor laser device and the corresponding optical waveguide devices and coupling the semiconductor laser device and the optical waveguide devices.

According to still another aspect of the invention, there is provided a method of coupling a semiconductor laser device having a stripe-shaped light-emitting section and a plurality of stripe-shaped nonlight-emitting section arranged in parallel with each others and a plurality of optical waveguide devices, said optical waveguide devices corresponding to said nonlight-emitting sections in number, a stripe-shaped groove being arranged on and along each of said nonlight-emitting sections, characterized in that it comprises steps of determining the relative positions of the light-emitting section and the optical waveguide devices by respectively referring to the corresponding nonlight-emitting sections, aligning the light-emitting section of the semiconductor laser device and the corresponding optical waveguide devices and coupling the semiconductor laser device and the optical waveguide devices.

According to still another aspect of the invention, there is provided a method of coupling a semiconductor laser device having a plurality of stripe-shaped light-emitting sections and a plurality of stripe-shaped nonlight-emitting sections arranged in parallel with each other and a plurality of optical waveguide devices, said optical waveguide devices corresponding to said light-emitting sections in number, a stripe-shaped groove being arranged on and along said nonlight-emitting section, characterized in that it comprises steps of determining the respective relative positions of the light-emitting sections and the corresponding optical waveguide devices by referring to the nonlight-emitting sections, aligning respectively the light emitting sections of the semiconductor laser device and the corresponding optical waveguide devices and coupling the semiconductor laser device and the optical waveguide devices.

With any of the above described coupling methods, the light-emitting section or at least one of the light-emitting sections, whichever appropriate, may be arranged between a pair of nonlight-emitting sections. For example, all the light-emitting sections may be arranged between a pair of nonlight-emitting sections. Alternatively, the light-emitting sections and the nonlight-emitting section may alternately be arranged.

With any of the above described coupling methods, the optical waveguide devices may be optical fiber(s) or, alternatively, they may be optical waveguides.

For the purpose of the invention, in each combination of a nonlight-emitting section consisting of an active layer and a stripe-shaped groove, the nonlight-emitting section is located under the stripe-shaped groove. Additionally, the nonlight-emitting section is arranged in parallel with and separated from the light-emitting sections located adjacent to it.

When a semiconductor laser device having a configuration as described above is observed from a cleavage plane, the stripe-shaped grooves can be visually recognized if the light-emitting section(s) and the nonlight-emitting section(s) may not be clearly observable.

Therefore, as viewed from a cleavage plane of a semiconductor laser device of the type under consideration by referring to the stripe-shaped groove(s) of the device, the nonlight-emitting sections can be located from the (known) vertical distance from it or them, whichever appropriate, from the corresponding groove(s) and hence the light-emitting sections can be located from the (known) horizontal distance from it or them, whichever appropriate, from the adjacent nonlight-emitting sections.

Thus, once the light-emitting sections(s) is or are, whichever appropriate, located, the semiconductor laser device can be optically coupled with at least one optical waveguide device in a simple and accurate manner.

With a method of manufacturing a semiconductor laser device according to the invention, a semiconductor laser device comprising at least one stripe-shaped light-emitting section, at least one stripe-shaped nonlight-emitting section and at least one grooves and having a configuration as described above can be obtained in a simple manner. The light-emitting sections of such a semiconductor laser device can be easily and accurately located.

Since a method of coupling a semiconductor laser device and at least one optical waveguide device according to the invention utilizes the end of at least one stripe-shaped grooves, the end surfaces of the light-emitting sections can be located easily and accurately to minimize the time required to locate them.

DETAILED DESCRIPTION OF BEST MODES OF CARRYING OUT THE INVENTION

Firstly, a preferred embodiment of semiconductor laser device according to the invention will be described by referring to FIG. 1.

Figure 1:
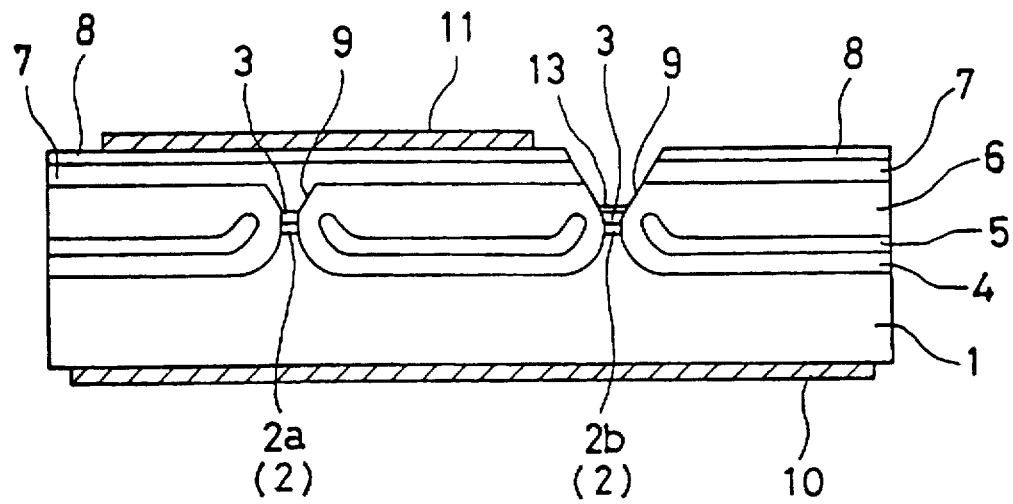
FIG. 1 is a schematic sectional view of a preferred embodiment of semiconductor laser device according to the invention.

In FIG. 1, the embodiment of semiconductor laser device comprises a p-semiconductor substrate 1, a stripe-shaped light-emitting section 2a (consisting of a stripe-shaped active layer 2), a stripe-shaped nonlight-emitting section 2b (also formed out of the active layer 2), an n-cladding layer 3, a p-buried layer 4, an n-buried layer 5, a p-buried layer 6, an n-cladding layer 7, grooves 9, a p-electrode 10, an n-electrode 11 and a dielectric mask 13.

The light-emitting section 2a and the nonlight-emitting section 2b arranged on the p-semiconductor substrate 1 are stripe-shaped and consisting of an active layer, they being arranged in parallel with each other.

The upper surface of the light-emitting section 2a and that of the nonlight-emitting section 2b are covered by an n-cladding layer 3 having a refractive index smaller than those of the two sections. A dielectric mask 13 is arranged on the n-cladding layer 3 on the nonlight-emitting section 2b.

The light-emitting section 2a and the nonlight-emitting section 2b are closely flanked at both sides by the p-buried layer 4, the n-buried layer 5 and the p-buried layer 6.

The stripe-shaped grooves 9 having a V-shaped cross section are arranged respectively on the upper surfaces of the light-emitting section 2a and the nonlight-emitting section 2b. While the stripe-shaped groove 9 on the light-emitting section 2a is buried in the n-cladding layer 7 arranged on the p-buried layer 6, the other stripe-shaped groove 9 on the nonlight-emitting section 2b is exposed to the ambient air as it is not buried in the n-cladding layer 7.

Note that the stripe-shaped groove 9 on the nonlight-emitting section 2b is not buried in an n-cap layer 8 arranged on the n-clad layer 7 to expose the nonlight-emitting section 2b.

The p-electrode 10 is located on the lower surface of the p-semiconductor substrate 1, whereas the n-electrode 11 is arranged on the upper surface of the n-cap layer 8 on the light-emitting section 2a.

Of the semiconductor laser device of FIG. 1, the p-electrode 10 and the n-electrode 11 are made of a gold alloy of a known and appropriate type and the dielectric mask 13 is made of a known and appropriate dielectric material, while the remaining components are made of a known and appropriate III-V group compound semiconductor substance (crystal or mixed crystal).

In a specific example, the semiconductor substrate 1 is a p-InP substrate and the active layer 2 of the light-emitting section 2a and the nonlight-emitting section 2b is made of InGaAsP. The both cladding layers 3 and 7 are made of n-InP and the two buried layers 4 and 6 are made of a p-InP, whereas the remaining buried layer 5 is made of n-InP and the cap layer 8 is made of n-InGaAsP. Additionally, the p-electrode 10 is made of Au-Zn and the n-electrode 11 is made of Au-Ge whereas the dielectric mask 13 is made of $SiO_2$.

When the semiconductor laser device of FIG. 1 is microscopically observed from a cleavage plane, the end surface of the stripe-shaped groove 9 arranged on the light-emitting section 2b is clearly visible. The light-emitting section 2a and the nonlight-emitting section 2b as well as the n-cladding layer 3 and the dielectric mask 13 arranged on the nonlight-emitting section 2b are formed according to a set of dimensionally specified values including the (horizontal) distance separating the two sections 2a and 2b and the thicknesses of the n-cladding layer 3 and the dielectric mask 13.

Thus, the light-emitting section 2a of the semiconductor laser device can be located by referring to the stripe-shaped groove 9 on the nonlight-emitting section 2b. Referring to FIG. 1, the nonlight-emitting section 2b is located by advancing downward from the bottom of the stripe-shaped groove 9 by a distance equal to the thickness of the n-cladding layer 3 and that of the dielectric mask 13 and then the light-emitting section 2a is located by horizontally advancing leftward from the nonlight-emitting section 2b by a given horizontal distance (separating the light-emitting section 2a and the nonlight-emitting section 2b).

Now the embodiment of semiconductor laser device of FIG. 2 will be described.

Figure 2:
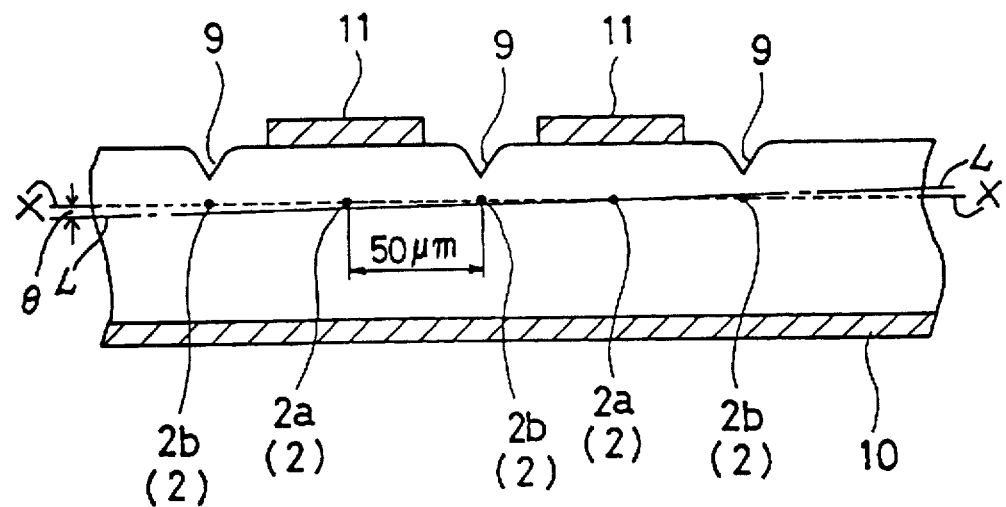
FIG. 2 is a schematic sectional view of another preferred embodiment of semiconductor laser device according to the invention.
Figure 3A:
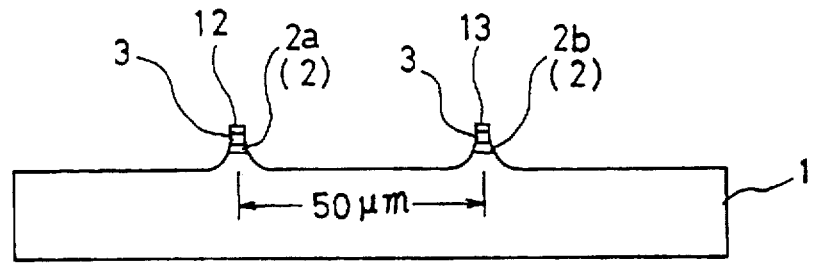
FIGS. 3(a)–3(d) are schematic sectional views of a semiconductor laser device, showing different steps of manufacturing a semiconductor laser device according to the invention.
Figure 3B:
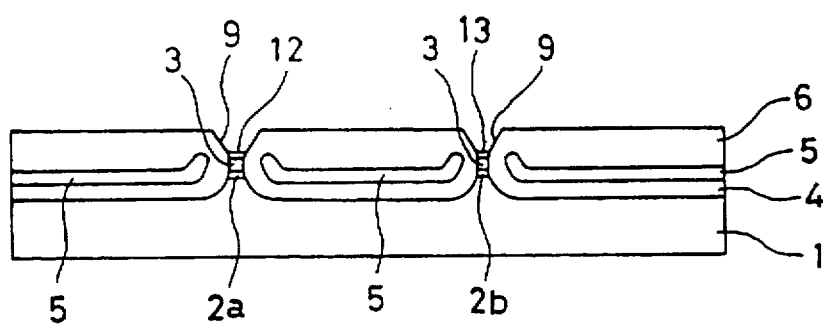
Figure 3C:
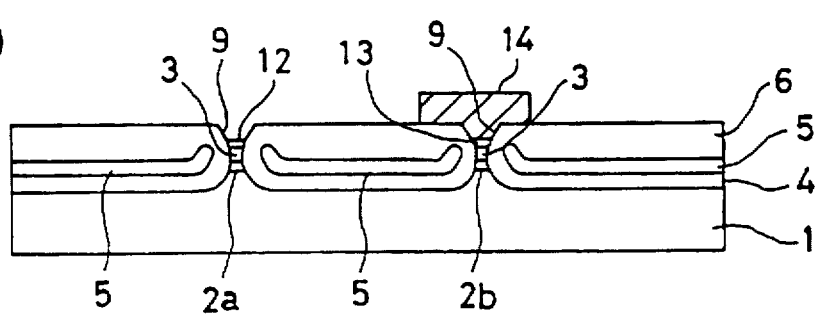
Figure 3D:
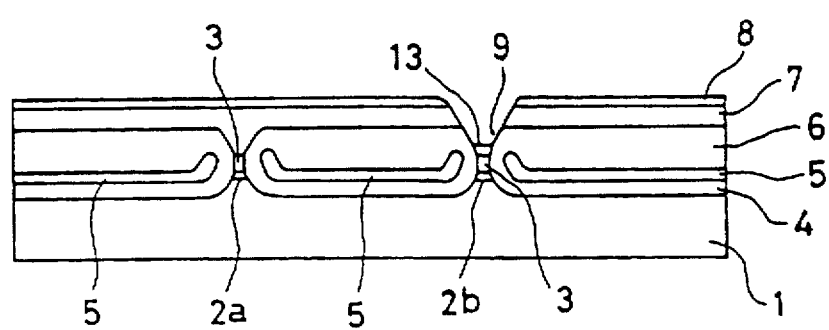

The embodiment of semiconductor laser device of FIG. 2 comprises a p-semiconductor substrate 1, light-emitting sections 2a consisting of an active layer 2, stripe-shaped nonlight-emitting sections 2b also consisting of the active layer 2, an n-clad layer 3, a p-buried layer 4, an n-buried layer 5, a p-buried layer 6, an n-cladding layer 7, an n-clad layer 8, stripe-shaped grooves 9, an n-cap layer 8, a p-electrode 10, n-electrodes 11 and dielectric masks 13.

As shown, unlike the embodiment of FIG. 1, the embodiment of FIG. 2 comprises a plurality of light-emitting sections 2a and a plurality of nonlight-emitting sections 2b arranged in an alternate manner and in parallel with each other. Except the stripe-shaped grooves 9 arranged on the respective nonlight-emitting sections 2b, these sections are covered by an n-cladding layer 3, a p-buried layer 4, an n-buried layer 5, a p-buried layer 6, an n-clad layer 7 and an n-cap layer 8. While a single p-electrode 10 is arranged on the lower surface of the p-semiconductor substrate 1, a plurality of n-electrodes 11 are arranged above the n-type cap layer on the each light-emitting sections 2a. Otherwise, dielectric masks 13 are arranged on the n-cladding layer 3 atrespective locations above the nonlight-emitting section 2b.

Note that the materials of the semiconductor laser device of FIG. 2 are identical as those of the device of FIG. 1.

In the case of the semiconductor laser device of FIG. 2, the light-emitting sections 2a can be located by referring to the stripe-shaped grooves 9 arranged on the respective nonlight-emitting sections 2b. Particularly with this embodiment, the light-emitting sections 2a can be located by referring to a line connecting the bottoms of the stripe-shaped grooves 9.

For the purpose of the present invention, the number of the light-emitting sections 2a and that of the nonlight-emitting sections 2b formed on a semiconductor substrate 1 are categorized into groups (a) through (e) as listed above. More specifically, there are four numerical relationships for "light-emitting section(s) versus nonlight-emitting section (s)" or "one to one", "more than one to one," "one to more than one" and "more than one to more than one."

Of these, when the numerical relationship between the light-emitting section(s) and the nonlight-emitting section(s) is 2 to 1, the nonlight-emitting section 2b is disposed between the light-emitting sections. When the relationship between the light-emitting section(s) and the nonlight-emitting section(s) is 1 to 2, the light-emitting section 2a is disposed between the nonlight-emitting sections 2b. When the relationship between the light-emitting section(s) and the nonlight-emitting section(s) is more than two to two, the light-emitting sections 2a are disposed between the two nonlight-emitting sections 2b.

The arrangement of FIG. 2, where the two nonlight-emitting sections 2b are disposed respectively at the leftmost and rightmost positions is advantageous when the line L connecting the light-emitting sections 2a and the nonlight-emitting sections 2b is inclined from the X-axis by an angle due to some inaccurate manufacturing operations because, as at least one light-emitting section 2a is arranged on the line L, they can be accurately located by referring to the line L for coupling the semiconductor laser device with corresponding optical waveguide devices.

Now, the method of manufacturing a semiconductor laser device as shown in FIG. 1 will be described by referring to (a) through (d) of FIG. 3.

In step (a) of FIG. 3, an InGaAsP active layer 2 and an n-InP clad layer 3 ere sequentially formed on a p-InP substrate 1 by MOCVD (metal organic chemical vapor deposition) or epitaxial growth and then 1.5 µm wide dielectric masks 12 and 13 are formed on the n-InP clad layer 3 in parallel with each other with a distance of 50 µm separating them. Thereafter, unnecessary areas of the substrate 1, the active layer 2 and the clad layer 3 are etched by means of a known etching technique to produce mesa stripes.

When this step is over, a stripe-shaped light-emitting section 2a consisting of the active layer 2 and a stripe-shaped nonlight-emitting section 2b also consisting of the active layer 2 are produced, the two sections being arranged in parallel with each other.

The dielectric mask 13 preferably has a width between 1 and 10 µm if the semiconductor laser device is coupled with an optical fiber, whereas it preferably has a width between 10 and 100 µm, if the semiconductor laser device is coupled with an optical waveguide. The width of 1.5 µm as described above for the dielectric mask 13 is, therefore, determined on the assumption that it is used with an optical fiber.

In step (b) of FIG. 3, a p-InP buried layer 4, an n-InP buried layer 5, a p-InP buried layer 6 are sequentially made to grow on the p-InP substrate to produce a pnp buried layer, using the dielectric masks 12 and 13 as a selective growth film.

Since no buried layer is made to glow on the dielectric masks 12 and 13 that operate as a selective growth film, a stripe-shaped groove 9 is formed on each of the light-emitting section 2a and the nonlight-emitting section 2b.

In step (c) of FIG. 3, after forming a resist mask 14 on the dielectric mask 13 in order to cover only the mask 13, the dielectric mask 12 is made to corrode by fluoric acid until it totally disappears. Thereafter, the resist mask 14 on the dielectric mask 13 is removed.

In step (d) of FIG. 3, an n-InP clad layer 7 and an n-InGaAsP cap layer 8 are sequentially formed on the p-InP substrate 1 by epitaxial growth.

In this step, while the groove 9 on the light-emitting section 2a is buried by the cladding layer 7, the latter and the cap layer 8 are not made to grow on the dielectric mask 13. Thus, the stripe-shaped groove 9 on the nonlight-emitting section 2b is left open without being buried by the buried layer 4 through 6, the cladding layer 7 and the cap layer 8.

In the subsequent steps, the p-InP substrate 1 is polished from the underside until it shows a thickness of about 100 µm. Then, a p-electrode (Au-Zn) 10 is fitted to the lower surface of the p-InP substrate 1 and an n-electrode (Au-Ge) 11 is arranged on the epitaxial growth side of the device.

Otherwise, if the dielectric mask 13 is not necessary, it is removed by corrosion as described earlier.

While the stripe-shaped groove 9 that provides a reference for locating the light-emitting section 2a formed on the nonlight-emitting section 2b is formed by utilizing the dielectric mask 13 that also operates as a selective growth film in the above steps of FIGS. 3(a) to 3(d), it may be formed without using such a mask. For instance, after forming the layers up to the clad layer 7 on a semiconductor substrate 1, such a stripe-shaped groove 9 can be produced by etching the layers on the nonlight-emitting section 2b to the desired profile of the groove.

However, the latter technique is accompanied by the following disadvantages.

(1) Two additional steps of preparing an etching mask and etching the layers are required.

(2) When the layer up to the cladding layer 7 are formed, the location of the nonlight-emitting section 2b is not visually confirmed. Therefore a mark may have to be put on the semiconductor wafer before forming the layer so that the nonlight-emitting section 2b can be exactly located.

(3) The etching operation would stop once the nonlight-emitting section 2b is exposed even partly and would not proceed any further. Consequently, the stripe-shaped groove 9 would not show a desired profile as a reference.

(4) If the layers are etched for an extended width to avoid the above problem, the stripe-shaped groove 9 would become disproportionally large and the device would start cracking from there.

To the contrary, the method as described above by referring to (a) through (d) of FIG. 3 uses a dielectric mask that also operates as a selective growth film to produce a stripe-shaped groove 9 so that the latter shows a desired profile without being accompanied by the problems listed above in (1) through (4).

A semiconductor laser device as illustrated in FIG. 2 can also be prepared in a manner similar to the one as described above.

As the semiconductor laser device of FIG. 2 comprises at least one light-emitting section 2a, at least one nonlight-emitting section 2b and at least one stripe-shaped groove 9, the above described steps (a) through (d) and the subsequent steps have to be modified appropriately in a manner obvious to those who are skilled in the art. A semiconductor laser device as described in any of the items (a) through (e) (except those illustrated in FIGS. 1 and 3) can also be prepared by appropriately modifying the above described method.

A semiconductor laser device as shown in FIG. 2 can be prepared by using a large semiconductor substrate 1 and following appropriate manufacturing steps of a first epitaxial growth, formation of strips, selective growth, preparation of resist masks, a second epitaxial growth, formation of electrodes, cleavage and others as substantially shown by (a) through (d) of FIG. 3. A semiconductor laser device as shown in FIG. 1 can be obtained by dividing the device of FIG. 2.

Now, a method of coupling a semiconductor laser device and an optical waveguide device according to the invention will be described by referring to FIG. 4.

Figure 4:
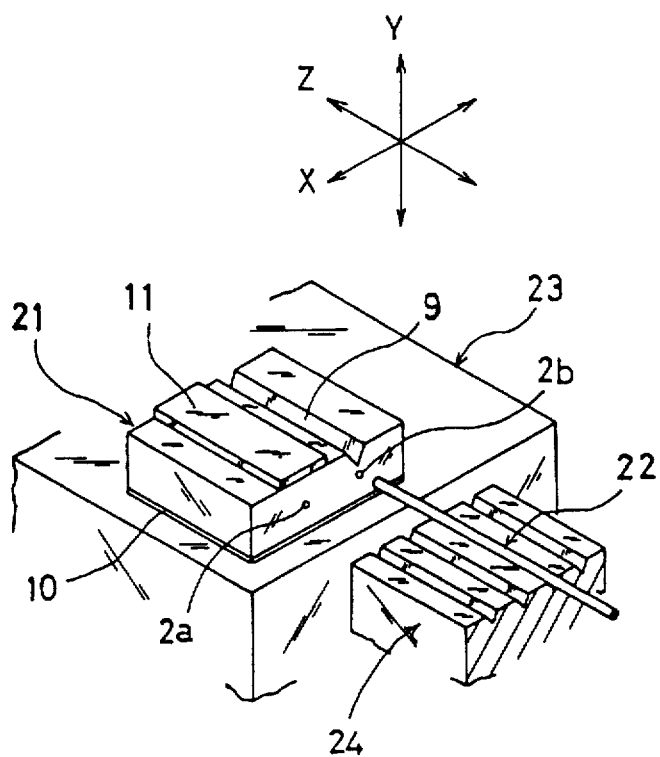
FIG. 4 is a schematic perspective view of a semiconductor laser device and an optical waveguide device, showing a method of coupling them according to the invention.

In FIG. 4, there are shown a pair of support tables 23 and 24, one or both of which are provided with a piezoelectric device, a step motor and other means necessary for finely adjusting their relative positions along X-, Y- and Z-axes shown in the drawing.

Referring to FIG. 4, when a semiconductor laser device 21 and an optical waveguide device 22 which is an optical fiber are set in position on the respective support tables 23 and 24, the optical axes of the devices run along the Z-axis and the end surface (cleavage plane) of the semiconductor laser device 21 to be connected to the optical waveguide device 22 faces the corresponding end surface of the latter.

Since the level of the nonlight-emitting section 2b of the semiconductor laser device 21 and that of the center of the core of the optical waveguide device (optical fiber) 22 are already known, the nonlight-emitting section 2b and the center of the core can be exactly located in terms of the Y-axis. In other words, it can be exactly determined if the nonlight-emitting section 2b and the center of the core of the optical fiber arranged on the respective support tables 23 and 24 are aligned in terms of the Y-axis and, if not, what is their mutual displacement y.

If the nonlight-emitting section 2b and the center of the core of the optical fiber are not aligned in terms of Y-axis on the respective support tables 23 and 24, they are aligned by moving one of the support tables 23 and 24 along the Y-axis (upward or downward) by an amount equal to y.

Then, in order to determine the positions of the devices in terms of the X-axis, the stripe-shaped groove 9 on the nonlight-emitting section 2b of the semiconductor laser device 21 and the optical waveguide device 22 are observed through a microscope (now shown). More specifically, it is determined by microscopic observation, if the stripe-shaped groove 9 of the semiconductor laser device 21 and the optical waveguide device 22 supported on the respective support tables 23 and 24 are aligned in terms of X-axis and, if not, what is their mutual displacement x.

If, in FIG. 4, the optical waveguide device 22 is displaced to the right relative to the stripe-shaped groove 9, the displacement is expressed by (−x), whereas it is expressed by (x) if the optical waveguide device 22 is displaced to the left relative to the groove 9. Assume here that the known horizontal distance separating the light-emitting section 2a and the nonlight-emitting section 2b is 50 μm.

If the optical waveguide device 22 is displaced to the right relative to the stripe-shaped groove 9, they are aligned in terms of the X-axis by moving the support table 24 leftward by a distance equal to [50−(−x)]=(50+x).

If, to the contrary, the optical waveguide device 22 is displaced go the left relative to the stripe-shaped groove 9, they are aligned in terms of the X-axis by moving the support table 24 rightward by a distance equal to [50−(+x)]=(50−x).

After aligning the light-emitting section 2a of the semiconductor laser device 21 and the center of the core of the optical waveguide device 22 in terms of the X- and Y-axes, the semiconductor laser device 21 is energized to emit a laser beam, which is made to enter the optical waveguide device 22, and the intensity of the layer beam is monitored by a monitoring means (not shown) arranged at the exit of the optical waveguide device 22. By finely and three-dimensionally adjusting further the mutual positional relationship of the semiconductor laser device 21 and the optical waveguide device 22 until a maximum intensity is obtained, the two devices can become optimally aligned.

Once the light-emitting section 2a of the semiconductor laser device 21 and the core of the optical waveguide device 22 are precisely aligned, the two devices are coupled to produce a module.

In the process of producing a module, the semiconductor laser device 21 and the optical waveguide device 22 may be subjected to single lens coupling or composite lens coupling.

Thereafter, the semiconductor laser device 21 is combined with other appropriate members before they are packaged.

Figure 5:
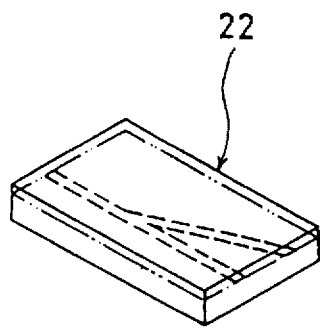
FIG. 5 is a schematic perspective view of an optical waveguide that can be suitably used as an optical waveguide device for the purpose of the invention.

The optical waveguide device 22 may be an multiple mode optical fiber, a single mode optical fiber, an optical waveguide as shown in FIG. 5 or any other appropriate optical waveguide.

Any of the above listed optical waveguide can be coupled with a semiconductor laser device 21 in a similar manner.

Likewise, a semiconductor laser device 21 and a plurality of optical waveguide devices (optical fibers) 22 or a semiconductor laser device as described in any of the items (a) through (e) (except those illustrated in FIGS. 1 and 3) and at least one corresponding optical waveguide devices can be coupled also in a similar manner.

Advantages and Industrial Applicability

With a semiconductor laser device according to the invention, the light-emitting section(s) can be accurately located by referring to the stripe-shaped grooves(s) so that the operation of coupling a semiconductor laser device and an optical waveguide device can be realized in a reduced period of time.

A method of manufacturing a semiconductor laser device according to the invention is characterized by its simplicity involving only a few processing steps including those of forming at least one stripe-shaped light-emitting sections, at least one stripe-shaped nonlight-emitting sections and at least one stripe-shaped grooves corresponding to the nonlight-emitting sections and therefore, with a method according to the invention, a desired semiconductor laser device can be prepared in a simple and reasonable manner.

With a method of coupling a semiconductor laser device and a optical waveguide device according to the invention, the coupling operation can be carried out accurately in a reduced period of time because any of the light-emitting sections of the optical waveguide device is aligned with the corresponding end surface of the semiconductor laser device by referring to a stripe-shaped groove.

As described above in detail, the present invention provides great advantages in the field of manufacturing and utilizing semiconductor laser device.

What is claimed is:

1. A semiconductor laser device having at least one stripe-shaped light-emitting section consisting of an active layer and at least one stripe-shaped nonlight-emitting section also consisting of the active layer, said light-emitting sections and said nonlight emitting sections being arranged in parallel with each other on a semiconductor substrate, and said light-emitting sections are covered by a semiconductor layer having a refractive index lower than that of the active layer, a stripe-shaped groove being arranged on and along the nonlight-emitting sections.

2. A semiconductor laser device according to claim 1, wherein a single light-emitting section and a single nonlight-emitting section are arranged in parallel with each other on a semiconductor substrate.

3. A semiconductor laser device according to claim 1, wherein a single light-emitting section and a plurality of nonlight-emitting sections are arranged in parallel with each other on a semiconductor substrate.

4. A semiconductor laser device according to claim 1, wherein a plurality of light-emitting sections and a single nonlight-emitting section in parallel with each other on a semiconductor substrate.

5. A semiconductor laser device according to claim 1, wherein a plurality of light-emitting sections and a plurality of nonlight-emitting sections are arranged in parallel with each other on a semiconductor substrate.

6. A semiconductor laser device according to claim 1, wherein a plurality of light-emitting sections and a plurality of nonlight-emitting sections are arranged in parallel with each other on a semiconductor substrate and at least a light-emitting section is located between a pair of nonlight-emitting sections.

7. A method of manufacturing a semiconductor laser device characterized in that it comprises steps of:

sequentially depositing an active layer and a cladding layer on a semiconductor substrate, processing the active layer and the cladding lawyer into at least one stripe-shaped light-emitting sections and at least one stripe-shaped nonlight-emitting section arranged in parallel with each other, forming a stripe-shaped groove on each of the light-emitting sections and the nonlight-emitting sections by covering the upper surface of the device in areas other than those of the light-emitting sections and the nonlight-emitting sections with a semiconductor layer having a refractive index lower than that of the active layer, and burying the stripe-shaped grooves only on the light-emitting sections with a semiconductor layer.

8. A method of manufacturing a semiconductor laser device according to claim 7, wherein a single light-emitting section and a single nonlight-emitting section are formed.

9. A method of manufacturing a semiconductor laser device according to claim 7, wherein a single light-emitting section and a plurality of nonlight-emitting sections are formed.

10. A method of manufacturing a semiconductor laser device according to claim 7, wherein a plurality of light-emitting sections and a single nonlight-emitting section are formed.

11. A method of manufacturing a semiconductor laser device according to claim 7, wherein a plurality of light-emitting sections and a plurality of nonlight-emitting sections are formed.

12. A method of manufacturing a semiconductor laser device according to clam 7, wherein the light-emitting sections and the nonlight-emitting section are formed in such a manner that at least one light-emitting section is interposed between the two nonlight-emitting sections.

13. A method of coupling a semiconductor laser device having a stripe-shaped light emitting section and a stripe-shaped nonlight-emitting section arranged in parallel with each other, a stripe-shaped groove being arranged on and along said nonlight-emitting section, and an optical waveguide device, characterized in that it comprises steps of determining the relative positions of the light emitting section and the optical waveguide device by referring to the groove on the nonlight-emitting section, aligning the light-emitting section of the semiconductor laser device.

14. A method of coupling a semiconductor laser device having a plurality of stripe-shaped light-emitting sections and a stripe-shaped nonlight-emitting section arranged in parallel with each other and a plurality of optical waveguide devices, a stripe-shaped groove being arranged on and along said nonlight-emitting section, characterized in that it comprises steps of determining the respective relative positions of the light-emitting sections and the corresponding optical waveguide devices by referring to the nonlight-emitting section, aligning respectively the light-emitting sections of the semiconductor laser device and the corresponding optical waveguide devices and coupling the semiconductor laser device and the optical waveguide devices.

15. A method of coupling a semiconductor laser device having a stripe-shaped light-emitting section and a plurality of stripe-shaped nonlight-emitting section arranged in parallel with each others and a plurality of optical waveguide devices, said optical waveguide devices corresponding to said nonlight-emitting sections in number, a stripe-shaped groove being arranged on and along each of said nonlight-emitting sections, characterized in that it comprises steps of determining the relative positions of the light-emitting section and the optical waveguide devices by respectively referring to the corresponding nonlight-emitting sections, aligning the light-emitting section of the semiconductor laser device and the corresponding optical waveguide devices and coupling the semiconductor laser device and the optical waveguide devices.

16. A method of coupling a semiconductor laser device having a plurality of stripe-shaped light-emitting sections and a plurality of stripe-shaped nonlight-emitting sections arranged in parallel with each other and a plurality of optical waveguide devices, said optical waveguide devices corresponding to said light-emitting sections in number, a stripe-shaped groove being arranged on and along said nonlight-emitting section, characterized in that it comprises steps of determining the respective relative positions of the light-emitting sections and the corresponding optical waveguide devices by referring to the nonlight-emitting sections, aligning respectively the light emitting sections of the semiconductor laser device and the corresponding optical waveguide devices and coupling the semiconductor laser device and the optical waveguide devices.

17. A method of coupling a semiconductor laser device and an optical waveguide device according to claim 16, wherein the light-emitting section or at least one of the light-emitting sections, whichever appropriate, is arranged between a pair of nonlight-emitting sections.

18. A method of coupling a semiconductor laser device and an optical waveguide device according to claim 13, wherein the optical waveguide device is an optical fiber or the optical waveguide devices are optical fibers, whichever appropriate.

19. A method of coupling a semiconductor laser device and an optical waveguide device according to claim 16, wherein the optical waveguide device is an optical waveguide or the optical waveguide devices are optical waveguides, whichever appropriate.

* * * * *